US006459590B2

(12) United States Patent
Malnati

(10) Patent No.: US 6,459,590 B2
(45) Date of Patent: Oct. 1, 2002

(54) CENTRAL UNIT FOR GROUPING ELECTRONIC COMPONENTS OF REFRIGERATORS, FREEZERS AND SIMILAR APPLIANCES

(75) Inventor: Roberto Malnati, Buguggiate (IT)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 09/883,118

(22) Filed: Jun. 15, 2001

(30) Foreign Application Priority Data

Jun. 20, 2000 (IT) .................................... MI00U0372 U

(51) Int. Cl.[7] ................................................ H05K 5/00

(52) U.S. Cl. ....................... 361/752; 361/811; 361/688; 361/801; 361/797; 439/694; 439/693; 439/639

(58) Field of Search ................................ 361/752, 763, 361/785, 797, 811, 821, 687, 688, 691, 801; 439/638, 639, 692, 693, 912

(56) References Cited

U.S. PATENT DOCUMENTS

| | | | | | |
|---|---|---|---|---|---|
| 3,571,779 | A | * | 3/1971 | Collier | 235/380 |
| 4,168,877 | A | * | 9/1979 | Little et al. | 361/788 |
| 4,952,175 | A | * | 8/1990 | Waters et al. | 439/681 |
| 5,271,739 | A | * | 12/1993 | Denlinger et al. | 439/466 |
| 5,995,380 | A | * | 11/1999 | Maue et al. | 174/254 |
| 6,183,275 | B1 | * | 2/2001 | Okura et al. | 439/157 |
| 6,249,104 | B1 | * | 6/2001 | Janicek | 318/781 |

* cited by examiner

*Primary Examiner*—David Martin
*Assistant Examiner*—Hung Bui
(74) *Attorney, Agent, or Firm*—Robert O. Rice; Thomas J. Roth; Stephen D. Krefman

(57) ABSTRACT

A central unit for grouping electronic and electrical components of refrigerators, freezers and similar appliances, comprising a housing containing at least one electronic card provided with electrical connection means and socket means for connecting the appliance to the electrical power supply.

6 Claims, 1 Drawing Sheet

CENTRAL UNIT FOR GROUPING ELECTRONIC COMPONENTS OF REFRIGERATORS, FREEZERS AND SIMILAR APPLIANCES

BACKGROUND OF THE INVENTION

1. Field of the Invention

The present invention relates to a central unit for grouping electronic and electrical components of refrigerators, freezers and similar appliances.

2. Description of the Related Art

In the aforelisted appliances, electrical and electronic components are variously connected together and to the electrical power supply by cables. By way of example, a refrigerator can comprise at least one lamp for lighting the refrigerated compartment or compartments, electrical equipment such as fans, controls and the like, at least one compressor, thermostats and other controls, and an electrical or electronic circuit which receives data provided by the thermostats and controls and thereby controls operation of one or more of the aforesaid components.

The multiplicity of connections and cabling resulting can be criticised not so much for its appearance but more for the time required to make these connections during the manufacture of the appliance (refrigerator) and in identifying and remedying a fault or malfunction during maintenance.

SUMMARY OF THE INVENTION

An object of the present invention is to provide a central unit which enables connections and cabling to be simplified and hence favourably affect the cost of the operations concerned.

This and further objects which will be more apparent from the ensuing detailed description are attained by a central unit in accordance with the teachings of the accompanying claims.

BRIEF DESCRIPTION OF THE DRAWINGS

The invention will be more apparent from the detailed description given hereinafter by way of non-limiting example with reference to the accompanying drawing, in which.

DESCRIPTION OF THE INVENTION

Figure 1:
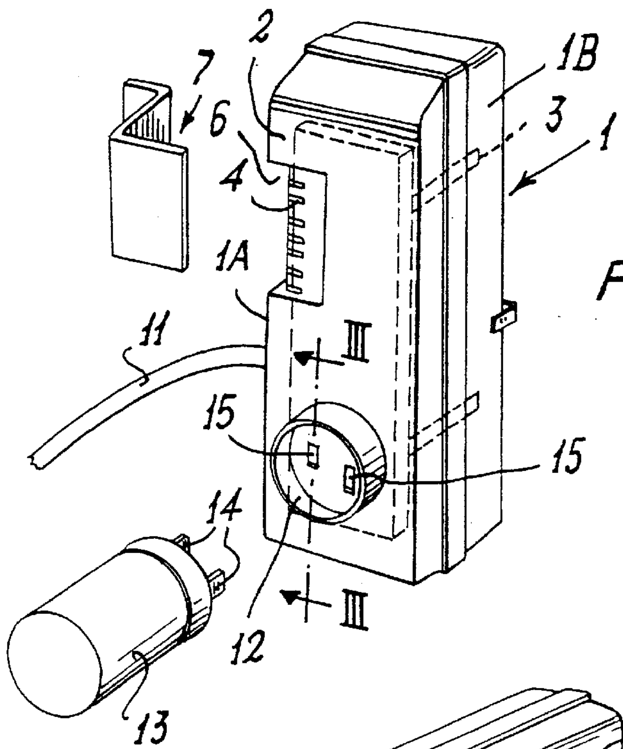
FIG. 1 is a perspective view with parts separated, showing the central unit of the invention.

With reference to FIG. 1, the central unit of the invention is in the form of a housing 1, constructed by moulding plastic material and consisting basically of two parts 1A, 1B removably connected together by traditional means. Inside the housing 1 there is housed an electronic circuit board 2, for example fixed by screw means to one of said parts, for example 1B, on supports 3 moulded in one piece with said part.

Figure 2:
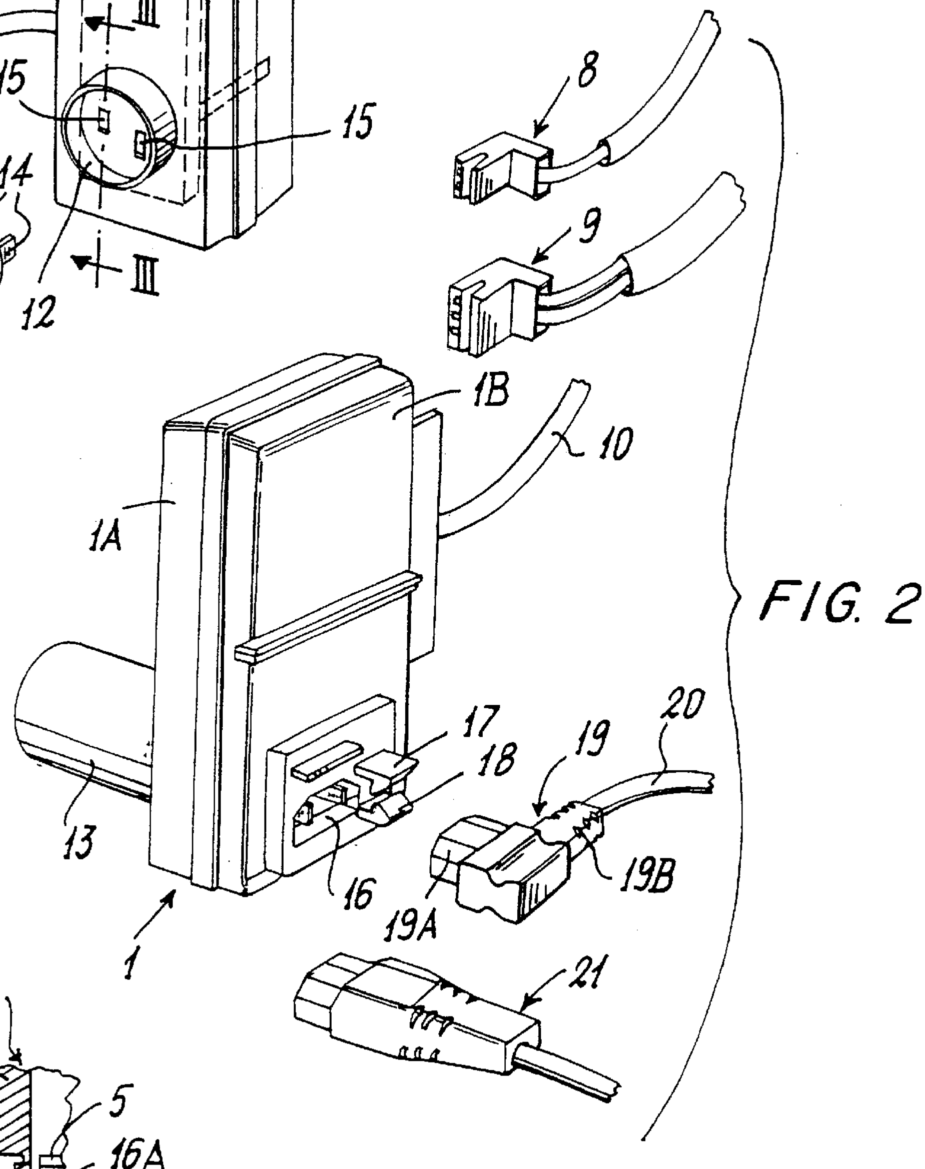
FIG. 2 is again a perspective view with parts separated, showing the central unit of the invention, but taken from the opposite side.

The electronic circuit board typically includes metal contacts in accordance with the requirements for pin connectors (these contacts are partly visible in FIG. 1 where they are indicated by 4), designed for push-on connectors ( push-on connectors are partly shown in FIG. 2 where they are indicated by 8 and 9).

The contacts 4 are accessible from the outside the housing 1 through at least one aperture 6 present in the housing 1 and closable by a cover 7 (for example by snapengagement).

Contacts 4 are intended to be engaged, for example, by the cable plugs 8 and 9, one (8) for powering a lighting lamp, the other (9) for powering electrical equipment (for example fans). The cover 7 enables the contacts 4 involving the cabled plugs 8 and 9 to be insulated from external agents. On the cover 7 there are provided passageways (not shown) for the sealed exit of the cables connected to the plugs 8 and 9. By means of a connector, not shown, a usual thermostat can be connected via cable 10 to the contacts 4 to provide the control part of the circuit board 2 with data for controlling the operation of the compressor or compressors that is (are) powered by a cable 11 which enters the housing through an aperture, not shown. The cable 11 is connected to an electronic relay or switch, mounted on the circuit board or in the housing, and controlled by the electronic circuit provided for this purpose.

Figure 3:
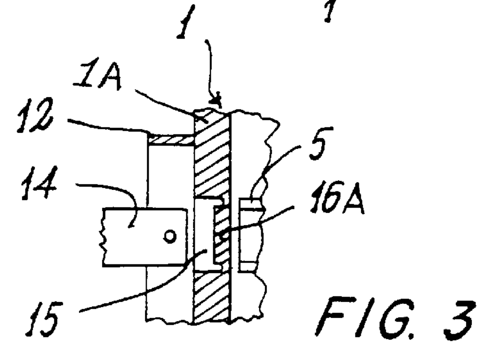
FIG. 3 is a schematic partial section on the line III—III of FIG. 1.

The part 1A of the casing 1 also includes a socket 12 to enable a conventional capacitor 13 to be mounted if required by the compressor motor. In the usual manner, the capacitor includes two blades 14 for connecting the capacitor to the circuit board 2. Connection to the circuit board 2 may be by push-on connectors 5 through slots 15 formed in the socket 12. As shown in FIG. 3, slots 15 are closed by a film or thin layer 16A, provided during the moulding of the housing 1. Film 16A is designed to be broken when the capacitor 13 is mounted on the housing 1A to enable the electrical connection to be made between the blade 14 and push-on connector 5. The films 16A close the slots 15 (if the capacitor is not used) to prevent entry of water or moisture into the housing 1.

As can be seen from FIG. 2, the part 1B of the housing 1 is provided with a socket 16 to facilitate connection of the central unit to the electrical power supply. Adjacent to socket 16 two projecting hook- shaped appendices 17, 18 are provided for latching a plug 19 to the socket and maintaining it coupled. The angle plug 19 has two parts 19A and 19B, positioned at an angle to each other. The part 19A enters the socket 16 while the part 19B passes between the hook-shaped appendices 17, 18 to force these apart elastically and then be secured in the space between them to securely retain plug 19 connected to control unit 1. The angle plug is connected to a cable 20 provided, at its opposite end, with a plug for connection to the electric power supply. The cable 20 can be supplied with the appliance (refrigerator or the like) and can be connected by the user himself, and not necessarily during manufacture.

During the manufacture and/or testing of the appliance a plug 21 can used for connection to the socket 16. Plug 21 can be easily connected and disconnected from socket 16 because it does not engage the hook-shaped appendices 17, 18.

The invention has the advantage of enabling the connections and cabling to be put into a state of order and the number of components (for example brackets, nuts, connectors etc.) involved in completing the electrical-electronic part of the appliance to be reduced. The invention also enables the capacitor to be easily mounted. The provision of the hook-shaped appendices 17, 18 (and in particular their positioning to the side of the socket 16) afford a way of simplifying or reducing the series of steps and/or operations currently used during the manufacture of the household electrical appliance (refrigerator, freezer and the like). In this respect, the invention enables the electrical supply cables to use angle plugs, which can be installed by the user (as stated heretofore).

The electrical supply cables do not need to be installed on the appliance production line, but instead can be installed when the appliance is installed in a user's home. The hook-shaped appendices ensure that the angle plug will not become detached or withdrawn even in the case of impact or vibration. The use of a straight plug, that does not engage the hook-shaped appendices 17, 18, enables testing to be simplified and allows standardization of the connection system on all production lines. For the same product (appliance) and product appearance, storage standardization can be achieved for the packaged product if the cable 20 with its angle plug 19 is kept external to the product or inserted only on its shipment. Further, use of a separable cable 20 for connecting the appliance to the electric power source can allow use of different cables with different plugs for connection to the electrical power supply such as may be required according to the electrical codes in different countries without requiring a separate, different, model for appliances differing only in the configuration of the plug for connection to the electrical power supply.

I claim:

1. A central unit for grouping electronic and electrical components of a refrigerator or freezer, including:

a housing, at least one electronic circuit board mounted in said housing and including electrical connection means accessible through a closable opening in said housing for connecting at least one cable and plug for powering an electrical component of said refrigerator or freezer, a cover for said closable opening having passageways corresponding in number to the number of cable and plugs to be connected to said electronic circuit board, and a socket on said housing for connection of said appliance to an electric power source wherein hook-shaped appendices are provided adjacent said socket to engage an angle plug and thereby retain said angle plug in said socket but not engage a straight plug in said socket and thereby allow free engagement/disengagement of a straight plug.

2. A central unit as claimed in claim 1, wherein the housing includes a second socket for connection of a capacitor to said circuit board.

3. A central unit as claimed in claim 2, wherein said second socket includes slots for the capacitor electrical connection blades, which are closed by a thin wall breakable on engagement by said capacitor electrical connection blades.

4. A central unit for grouping electronic and electrical components of a refrigerator or freezer, including:

a housing, at least one electronic circuit board mounted in said housing and including electrical connection means accessible through a closable opening in said housing for connecting at least one cable and plug for powering an electrical component of said refrigerator or freezer, a cover for said closable opening having passageways corresponding in number to the number of cable and plugs to be connected to said electronic circuit board, a first socket on said housing for connection of said appliance to an electric power source including hook-shaped appendices adjacent said first socket and arranged to engage an angle plug to retain said angle plug in said first socket but allow free engagement/disengagement of a straight plug in said socket, and a second socket on said housing for connection of a capacitor to said circuit board.

5. A central unit as claimed in claim 4 wherein said second socket includes slots for capacitor electrical connection blades, said slots being closed by a thin wall breakable on engagement by said capacitor electrical connection blades.

6. A central unit for grouping electronic and electrical components of a refrigerator or freezer, including:

a housing, at least one electronic circuit board mounted in said housing and including electrical connection means accessible through a closable opening in said housing for connecting at least one cable and plug for powering an electrical component of said refrigerator or freezer, a cover for said closable opening having passageways corresponding in number to the number of cable and plugs to be connected to said electronic circuit board, a first socket on said housing for connection of said appliance to an electric power source including hook-shaped appendices adjacent said first socket and arranged to engage an angle plug to retain said angle plug in said first socket but allow free engagement/disengagement of a straight plug in said first socket, a second socket on said housing for connection of a capacitor to said circuit board including slots for capacitor electrical connection blades, said slots being closed by a thin wall breakable on engagement by said capacitor electrical connection blades.

* * * * *